(12) United States Patent
Isoda et al.

(10) Patent No.: US 8,604,397 B2
(45) Date of Patent: Dec. 10, 2013

(54) COOKING DEVICE

(75) Inventors: Keiko Isoda, Hyogo (JP); Hiroshi Tominaga, Hyogo (JP); Tamotsu Izutani, Hyogo (JP); Sadatoshi Tabuchi, Osaka (JP); Kuniaki Sakakibara, Hyogo (JP)

(73) Assignee: Panasonic Corporation, Osaka (JP)

( * ) Notice: Subject to any disclaimer, the term of this patent is extended or adjusted under 35 U.S.C. 154(b) by 963 days.

(21) Appl. No.: 12/523,946

(22) PCT Filed: Jan. 22, 2008

(86) PCT No.: PCT/JP2008/050812
§ 371 (c)(1),
(2), (4) Date: Jul. 21, 2009

(87) PCT Pub. No.: WO2008/090886
PCT Pub. Date: Jul. 31, 2008

(65) Prior Publication Data
US 2009/0303201 A1  Dec. 10, 2009

(30) Foreign Application Priority Data

Jan. 22, 2007 (JP) ................. 2007-011402
Jan. 22, 2007 (JP) ................. 2007-011405

(51) Int. Cl.
*H05B 6/12* (2006.01)
(52) U.S. Cl.
USPC .......................... 219/625; 219/451
(58) Field of Classification Search
USPC ........... 219/443.1, 468.2, 507, 486, 489, 511, 219/627, 494, 667, 626; 341/33, 34, 27; 99/325, 329, 339
See application file for complete search history.

(56) References Cited

U.S. PATENT DOCUMENTS 4,105,902 A     8/1978   Iwai et al.
5,155,338 A *  10/1992   Hoffmann .................. 219/445.1
(Continued)

FOREIGN PATENT DOCUMENTS

EP      0 042 167          12/1981
EP      0042167 B1 *       12/1981
(Continued)

OTHER PUBLICATIONS

Supplementary European Search Report issued Jan. 30, 2012 in Application No. EP 08 70 3656.

(Continued)

*Primary Examiner* — Henry Yuen
*Assistant Examiner* — Phuong Nguyen
(74) *Attorney, Agent, or Firm* — Wenderoth, Lind & Ponack, L.L.P.

(57) ABSTRACT

There is provided a cooking device that prevents operation based on a control command assigned to a touch key from being executed when a user is not intending to operate the touch key. The cooking device includes an electrode unit which includes a key electrode (3a) provided on the lower surface of the top plate and a contact electrode (3b) electrically connected with the key electrode and inputs the assigned control command; a cancel electrode (5a) provided at the periphery of the contact electrode so that the distance between the contact electrode and the cancel electrode is smaller than the width of the finger of the user; and a control unit (8) for controlling conduction to a heating source based on the control command assigned to the electrode unit when detecting that the vicinity of the electrode unit is touched. The control unit (8) limits the operation based on the control command when detecting that the vicinity of the cancel electrode is touched.

11 Claims, 5 Drawing Sheets

(56) References Cited

U.S. PATENT DOCUMENTS

| | | |
|---|---|---|
| 5,189,417 A | 2/1993 | Caldwell et al. |
| 5,717,189 A | 2/1998 | Goetz et al. |
| 5,917,165 A * | 6/1999 | Platt et al. .................. 200/600 |
| 6,310,611 B1 | 10/2001 | Caldwell |
| 6,466,036 B1 | 10/2002 | Philipp |
| 7,022,949 B2 | 4/2006 | Shukla |
| 7,370,649 B2 | 5/2008 | Gama et al. |
| 2002/0144886 A1 | 10/2002 | Engelmann et al. |

FOREIGN PATENT DOCUMENTS

| | | | |
|---|---|---|---|
| JP | 52-67367 | 6/1977 | |
| JP | EP 0042167 | * 12/1981 | ............... H05B 6/12 |
| JP | 58-10335 | 1/1983 | |
| JP | 10-214677 | 8/1998 | |
| JP | 2003-279055 | 10/2003 | |
| JP | 2003-303673 | 10/2003 | |
| JP | 2003-303674 | 10/2003 | |
| JP | 2005-38739 | 2/2005 | |
| JP | 2005-166392 | 6/2005 | |
| JP | 2005-251504 | 9/2005 | |
| JP | 2005-300030 | 10/2005 | |
| JP | 2006-207843 | 8/2006 | |
| JP | 2007-120857 | 5/2007 | |

OTHER PUBLICATIONS

International Search Report issued May 1, 2008 in the International (PCT) Application No. PCT/JP2008/050812.
International Search Report issued May 1, 2008 in International (PCT) Application No. PCT/JP2008/050813.
U.S. Office Action issued Oct. 25, 2011 in U.S. Appl. No. 12/523,904.
International Preliminary Report on Patentability issued Aug. 6, 2009 in International (PCT) Application No. PCT/JP2008/050812.
European Office Action issued Sep. 5, 2013 in corresponding European Application No. 08 703 657.0.

* cited by examiner

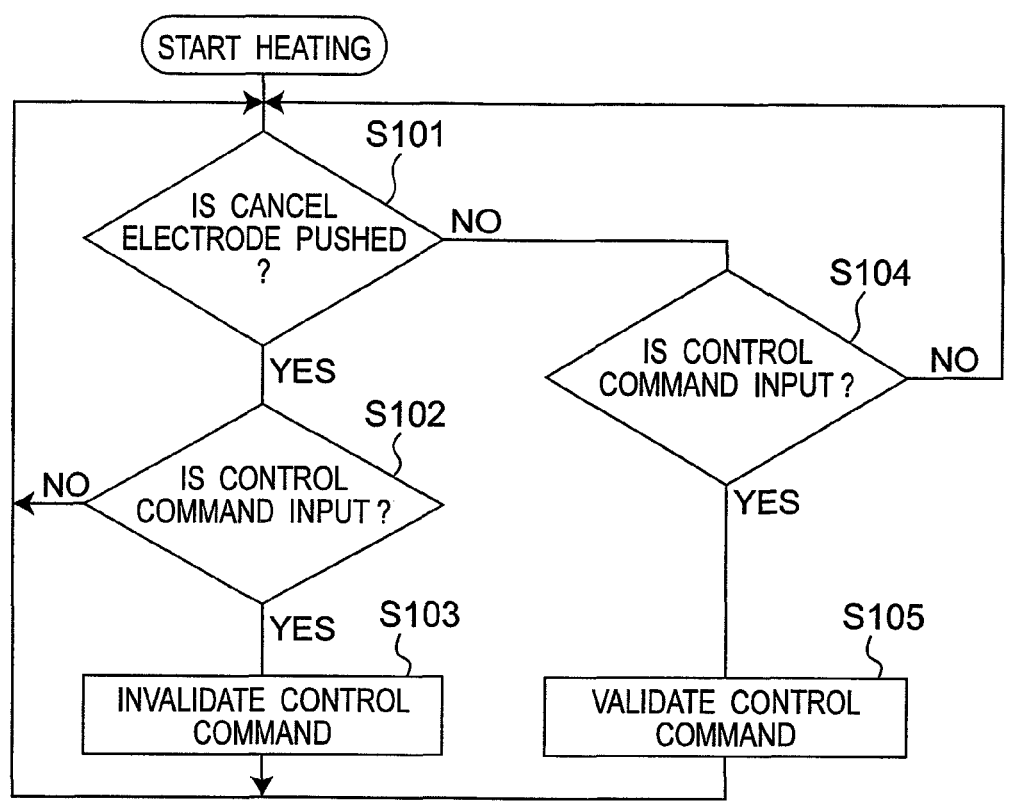
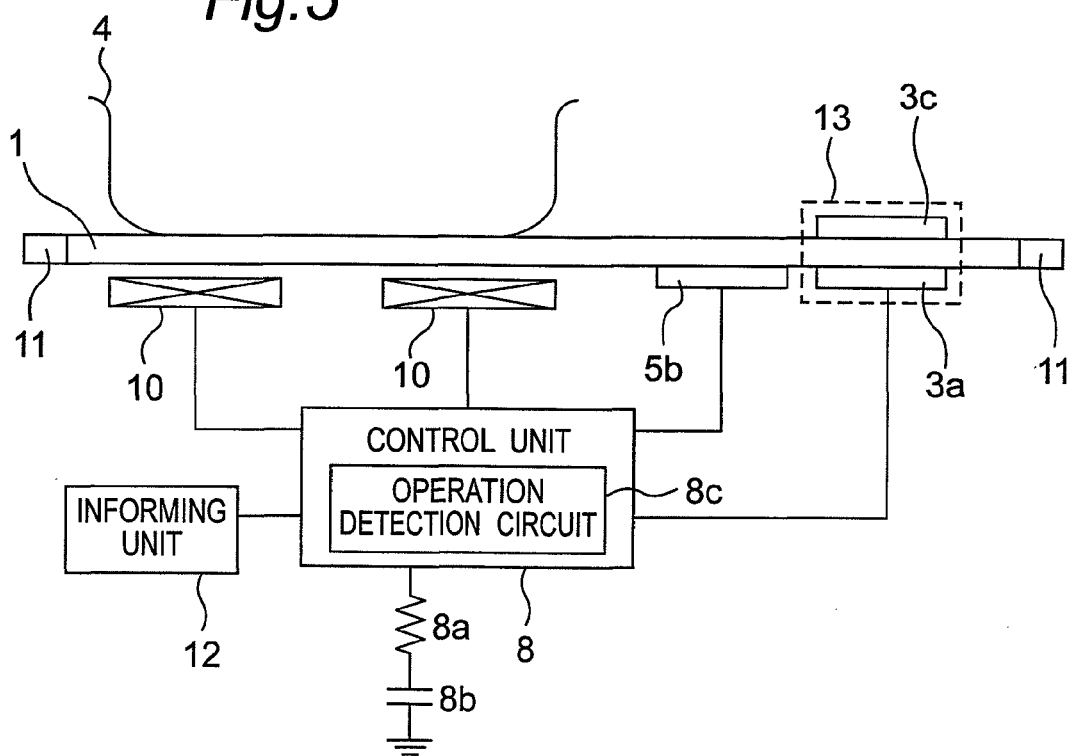

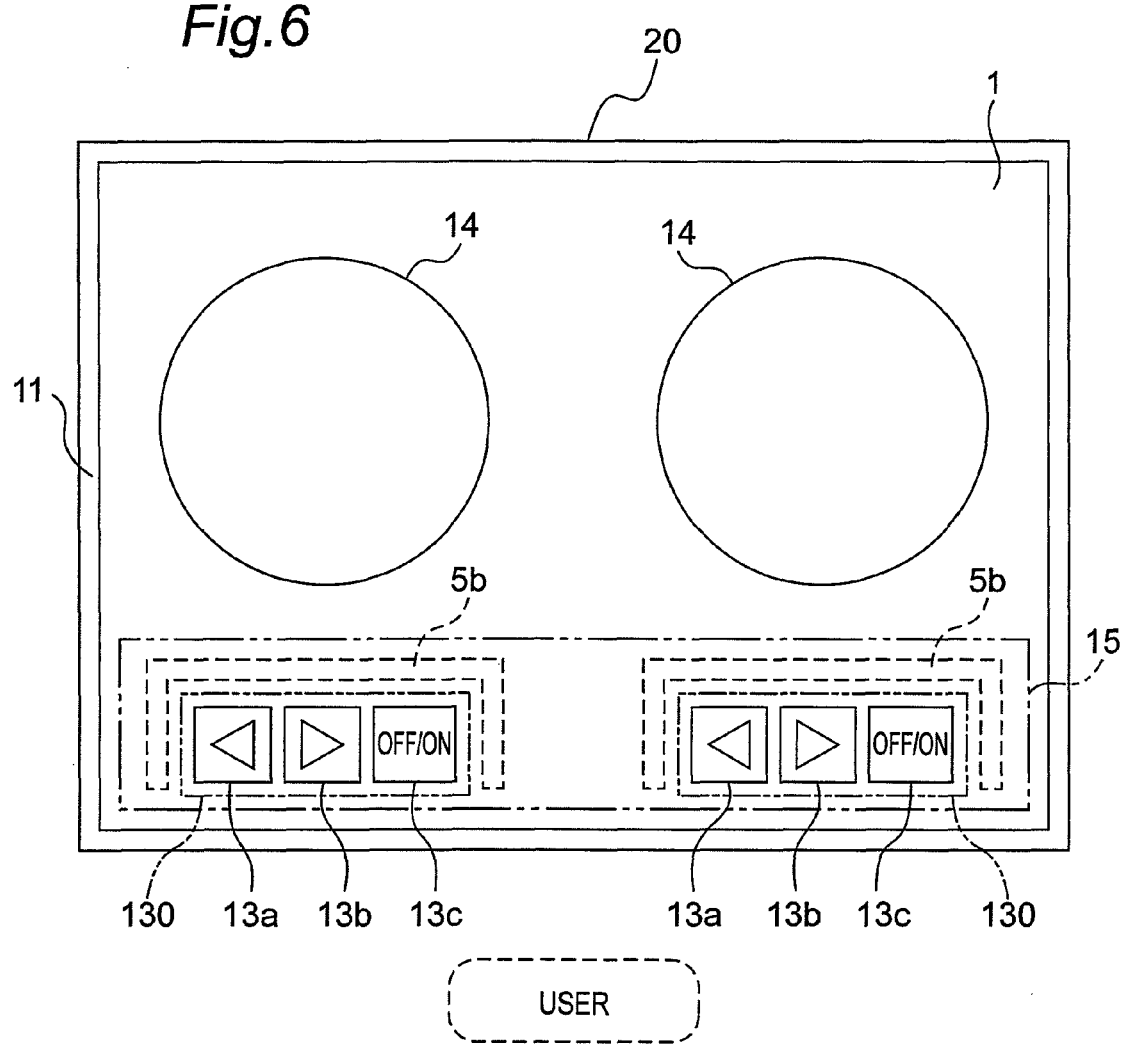

COOKING DEVICE

TECHNICAL FIELD

The present invention relates to a cooking device for heating an object to be heated such as a cooking container, in particular, to a cooking device including a touch key on a top plate.

BACKGROUND ART

In recent years, cooking devices such as an induction cooking device for induction heating a cooking container such as a pan with a heating coil and a gas cooking device for heating the cooking container with gas are widely used in general household and professional-use kitchens. Some of these heating cooking devices include an operation unit such as a touch key on an upper surface of a top plate (see e.g., patent documents 1 to 3).

The operation unit of patent document 1 includes one or more electrostatic capacitance touch keys. The touch key is a pair of key electrodes provided on the upper surface and the lower surface of the top plate. The key electrode on the lower surface side of the top plate is electrically connected to a contact electrode. The contact electrode is contacted with an end of a conductive connection member connected to a control unit. The control unit outputs a high frequency signal to the key electrode via the connection member and measures the magnitude of the signal output to the key electrode. When a finger of a user touches the touch key, the reduction of the magnitude of the high frequency signal output to the key electrode is transmitted to the control unit through the contact electrode and the connection member in correspondence to the increase in the electrostatic capacitance with respect to the earth of the key electrode (e.g., FIGS. 4 to 6 of patent document 1).

In the cooking device of patent document 2, an operation circuit substrate in which a planar electrode is formed with copper foil is provided on the lower side of the top plate, and a shield electrode connected to a common potential of a circuit for detecting the operation signal is provided at the periphery of the planar electrode to ensure the contacting range of the touch key. Thus, when the vicinity of the outer edge of the planar electrode is touched, the planar electrode and the vicinity of the shield electrode are both contacted, and thus the potential of the planar electrode lowers and the touch key can be easily operated.

In the cooking device of patent document 3, heating does not start if an object is placed on the periphery of the operation unit to enhance safety. Specifically, a peripheral state detection means for detecting whether an object is placed thereon is provided in the vicinity of the operation unit. Heating does not start if the peripheral state detection means detects that the object is placed on the peripheral state detection means.

Patent document 1: JP-A-2003-303673
Patent document 2: JP-A-10-214677
Patent document 3: JP-A-2006-207843

DISCLOSURE OF INVENTION

Problems to be Solved by the Invention

In the cooking device of patent document 1, the contact electrode for electrically connecting with the control unit is electrically connected with the key electrode for detecting the contact, and thus a signal similar to a signal when the touch key is touched is transmitted to the control unit even when the upper part of the contact electrode is pushed, that is, even when the upper surface of the top plate facing the contact electrode is touched by the user. Thus, when the upper surface of the top plate facing the contact electrode outside the range of the touch key is pushed, false operation unintended by the user might be carried out.

Patent document 2 and patent document 3 describe easily accepting the operation of the touch key when the outer edge of the touch key is touched to ensure the contacting range of the touch key or not starting the heating if an object is placed on the touch key to enhance safety, but do not disclose means for preventing false operation that is carried out when the upper part of the contact electrode for electrically connecting the touch key and the control unit is pushed. Thus, the shield electrode of patent document 2 and the peripheral state detection means of patent document 3 can not appropriately prevent the false operation when the upper part of the top plate facing the contact electrode at outside the range of the touch key is touched. Thus, when the upper part of the top plate facing the contact electrode is touched, the touch key might transmit the signal unintended by the user to the control unit.

Therefore, in the conventional cooking device, the touch key is activated and the operation based on the control command assigned to the touch key might be executed even when the user is not intending to operate the touch key.

In view of solving the above problems, it is an object of the present invention to provide a cooking device that prevents the operation based on the control command assigned to the touch key from being executed when the user is not intending to operate the touch key. In particular, it is an object to provide a cooking device that prevents false operation from being carried out when the user touches the outside of the range of the touch key such as the contact electrode.

Means for Solving the Problems

A cooking device includes: a heating source operable to heat an object to be heated; a top plate provided on an upper surface of the device; an electrode unit including a key electrode provided on a lower surface of the top plate and a contact electrode provided on the lower surface of the top plate to electrically connect with the key electrode and inputting an assigned control command when the top plate in the vicinity of the key electrode is touched with a finger; a control unit electrically connected with the contact electrode by means of a conductive connection member contacted with the contact electrode, the control unit being operable to apply a high frequency signal to the electrode unit and detect that the vicinity of the electrode unit is touched to control conduction to the heating source based on the control command; and a cancel electrode provided at a periphery of the contact electrode so that a distance between the contact electrode and the cancel electrode is smaller than a width of the finger of a user. The control unit is electrically connected with the cancel electrode by means of the other conductive connection member to apply a high frequency signal to the cancel electrode and limits the operation based on the control command when detecting that the vicinity of the cancel electrode is touched.

The limitation of the operation based on the control command when detecting that the vicinity of the cancel electrode is touched may include invalidating the conduction to the heating source based on the control command.

The limitation of the operation based on the control command when detecting that the vicinity of the cancel electrode is touched may include making the detection that the vicinity of the key electrode is touched difficult.

The control unit may invalidate the conduction control to the heating source based on the control command transmitted from the electrode unit when detecting that the vicinity of the cancel electrode is touched within a predetermined time after detecting a change in a state of the vicinity of the electrode unit from being touched to not being touched and/or when detecting that the vicinity of the electrode unit is touched within a predetermined time after detecting a change in a state of the vicinity of the cancel electrode from being touched to not being touched.

The control unit may make the detection that the vicinity of the key electrode is touched difficult within a predetermined time after detecting a change in a state of the vicinity of the cancel electrode from being touched to not being touched.

The control unit may include a key input detection reference value which is a reference in detecting that the vicinity of the key electrode is touched and may change the key input detection reference value to a value difficult to detect the touching of the vicinity of the key electrode when detecting that the vicinity of the cancel electrode is touched.

The control unit may include a cancel input detection reference value which is a reference in detecting that the vicinity of the cancel electrode is touched and may change the cancel input detection reference value to a value difficult to detect the touching of the vicinity of the cancel electrode when detecting that the vicinity of the key electrode is touched.

The cancel electrode is preferably provided to surround the key electrode and the contact electrode with a near side of the top plate opened.

The cooking device may further include a light source provided on a lower side of the key electrode, and the light source may irradiate a cutout portion formed by cutting out a part of the key electrode with light.

The cooking device may further include an informing unit operable to inform when the detection that the vicinity of the cancel electrode is touched and the detection that the vicinity of the key electrode is touched are simultaneously made.

The cooking device may further include an informing unit operable to inform when the touching of the vicinity of the cancel electrode is continuously detected for longer than or equal to a predetermined time.

The control unit may control the conduction to the heating source based on the control command when detecting that the vicinity of the key electrode is continuously touched for longer than or equal to a first predetermined time, and may invalidate the conduction control on the heating source based on the control command corresponding to the combination of one key electrode and the different key electrode when detecting that the vicinity of the different key electrode is touched before a second predetermined time longer than the first predetermined time has elapsed from when the vicinity of the one key electrode is touched.

Effect Of The Invention

According to the cooking device of the present invention, a cancel electrode is provided at the periphery of the contact electrode electrically connected with the key electrode configuring the touch key on the lower surface of the top plate, so that detection is made that the finger approaches the vicinity of the cancel electrode when the upper surface of the top plate at the vicinity of the contact electrode is touched with the finger. The operation of the heating source based on the control command assigned to the touch key is limited based on the contacting state of the finger with respect to the surface of the top plate at the vicinity of the cancel electrode. Thus the operation based on the control command assigned to the touch key is prevented from being executed when the user is not intending to operate the touch key. For instance, when the finger of the user touches the vicinity of the contact electrode provided at the outside of the range of the input operation region of the touch key, the heating operation unintended by the user is prevented from being mistakenly carried out.

BRIEF DESCRIPTION OF DRAWINGS

FIG. 4 is a flowchart showing the operation of the cooking device of the first embodiment of the present invention.

FIG. 5 is a configuration view of an entire cooking device of a second embodiment of the present invention.

FIG. 6 is a plan view of a top plate of the second embodiment of the present invention.

Figure 1:
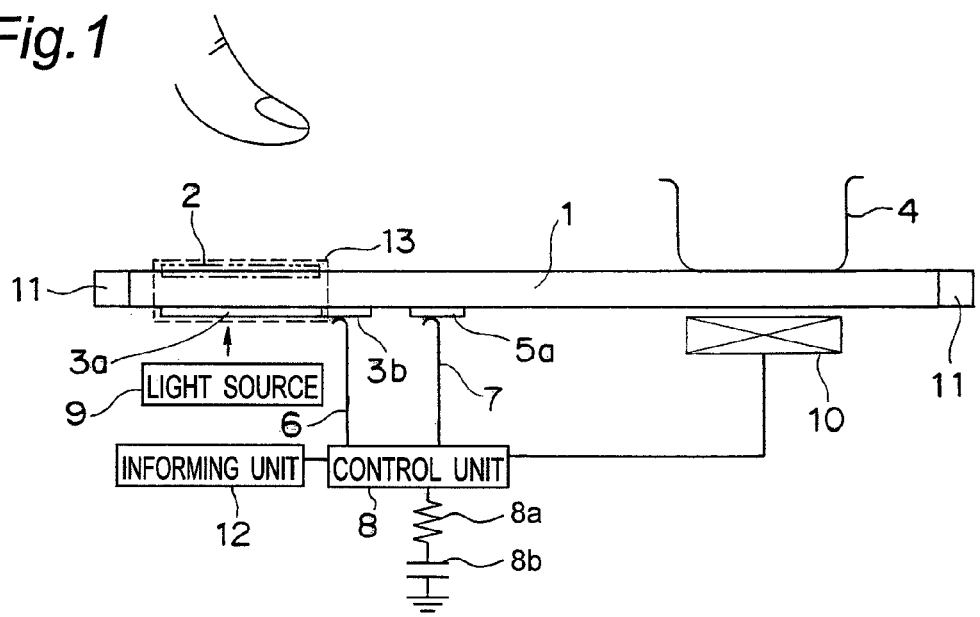
FIG. 1 is a side view showing a configuration of a cooking device of a first embodiment of the present invention.

DESCRIPTION OF REFERENCE NUMERALS 1 top plate
2 operation region
3 electrode unit
3a key electrode
3b contact electrode
3c operation electrode
3d region display frame
3e key display
4 object to be heated
5a cancel electrode
5b cancel electrode
6 connection member
7 connection member
8 control unit
8a resistor
8b capacitor
9 light source
10 heating coil
11 frame
12 informing unit
13 touch key
14 heating unit
15 non-painted region
20 upper surface of device
130 operation unit

BEST MODE FOR CARRYING OUT THE INVENTION

Embodiments of the present invention will be described with reference to the drawings.

<<First Embodiment>>

A cooking device of a first embodiment of the present invention is an induction cooking device including, as a heating source, an induction heating coil for induction heating an object to be heated on a top plate provided on the upper surface of the device, and has a function of preventing the false operation from being carried out when a user touches the outside of the range of an operation region displayed as an operation range of a touch key, in particular, the upper part of the top plate facing a contact electrode formed on the lower surface of the top plate to electrically connect the touch key to the control unit.

1.1 Configuration of Induction Cooking Device

Figure 2:
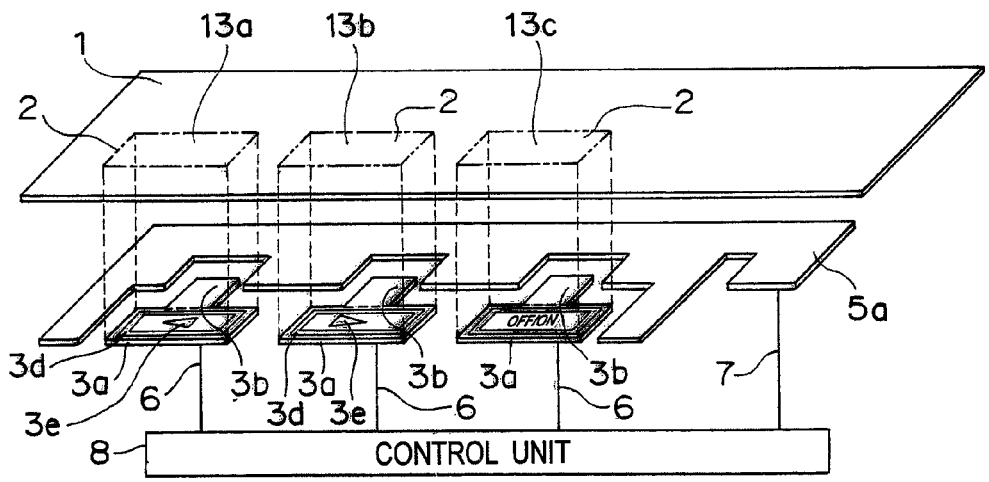
FIG. 2 is an exploded perspective view showing a part of the configuration of the cooking device of the first embodiment of the present invention.

FIG. 1 and FIG. 2 show a configuration of the induction cooking device of the first embodiment of the present invention. FIG. 1 is a side view of an overall configuration of the induction cooking device, and FIG. 2 is an exploded perspective view of a part of the configuration of the induction cooking device.

The induction cooking device of the present embodiment includes a top plate 1 for placing an object to be heated 4 such as a pan at an upper surface of the device. The top plate 1 is made of an electrical insulating object such as glass and transmits light. A frame 11, which is a frame body made of metal, is provided at the periphery of the top plate 1. The frame 11 is connected to a housing (not shown) outside the device grounded to the earth to have the same potential.

In the housing outside the device, a heating coil 10 for induction heating the object to be heated 4 is provided at the lower side of the top plate 1. The object to be heated 4 is placed on the upper surface of the top plate 1 in correspondence to the heating coil 10. The heating coil 10 is connected to a control unit 8 and is conduction controlled by the control unit 8.

An operation region 2 for inputting a control command instructing the heating control of the object to be heated 4 through operation is provided at the upper surface of the top plate 1, and key electrodes 3a are provided at the lower surface of the top plate 1 facing the operation region 2. In the present embodiment, the operation region 2 and the key electrodes 3a configure an electrostatic capacitance touch key 13. An electrode for enhancing the operation sensitivity may be provided in the operation region 2. The touch key 13 is provided on the nearer side than the heating coil 10, that is, on the user side so as to be easily operated by the user. The induction cooking device of the present embodiment includes a plurality of touch keys 13a to 13c (collectively referred to as touch key 13) as shown in FIG. 12, where each touch key 13 is assigned with a control command for controlling start/stop of heating and up/down of heating power and the like.

A contact electrode 3b for contacting a conductive connection member 6 is provided on the lower surface of the top plate 1. The contact electrode 3b is connected to the key electrode 3a, so that the key electrode 3a and the contact electrode 3b are electrically conducted. The key electrode 3a and the contact electrode 3b are hereinafter collectively referred to as an electrode unit 3. The electrode unit 3 is formed by providing a conductive print film such that the outer edge on the heating coil 10 side has a projecting shape when seen from above. The contact electrode 3b has the width and the length shorter than the key electrode 3a, and is provided to project out to the far side (heating coil 10 side than the user) than the key electrode 3a. One end of the conductive connection member 6 is contacted to the contact electrode 3b, and the other end is connected to the control unit 8, so that the key electrode 3a and the control unit 8 are electrically connected.

A light source 9 for irradiating the key electrode 3a is provided on the lower side of the key electrode 3a. The key electrode 3a includes a region display frame 3d of a predetermined width. The region display frame 3d is formed by cutting out, in the key electrode 3a, the vicinity of the outer edge of the key electrode 3a. The light from the light source 9 is passed through the region display frame 3d and radiated to the upper side of the top plate 1. The region display frame 3d indicates the operation region 2 of the touch key 3 to the user. Even if the region display frame 3d is cut out to a complete frame shape, the electrodes on the outer side and the inner side thereof are electrically connected by capacitance. The region display frame 3d may be cut out while forming a portion that is not cut out so as to have a frame shape as a whole. The connection member 6 for electrically connecting the electrode unit 3 and the control unit 8 is provided on the outer side of the operation region 2. Since the light source 9 is provided on the lower side of the key electrode 3a, the light is irradiated from the lower side of the key electrode 3a to the region display frame 3d and a key display 3e which is characters or symbols within the operation region 2, and thereby the region display frame 3d and a key display 3e can be displayed.

The control unit 8 is connected to a commercial power supply, and is configured by a rectifier, an inverter circuit including a switching element, a control circuit including a microcomputer, and the like. The control unit 8 includes an oscillation unit (not shown) for applying a high frequency signal of about 300 kHz to the contact electrode 3b and the key electrode 3a through the connection member 6. The frequency of the high frequency signal may be a frequency greater than or equal to 10 kHz and lower than a wireless frequency band, and the change in electrostatic capacitance of the electrode merely needs to be measured by touching the vicinity of the key electrode 3a with a finger. The oscillation unit is supplied with power with a transformer and the like. A common potential of the oscillation unit is connected to a ground potential (e.g., grounded device housing) by means of a series circuit of a resistor 8a (e.g., 100 Ω) and a capacitor 8b (e.g., 1000 pF), so that an impedance between the oscillation unit and the earth is determined. The method of setting the impedance is not limited thereto, and may be omitted depending on the configuration of the control unit 8. When the user touches the operation region 2 with a finger, a capacitor is formed by the finger of the user, the top plate 1, and the key electrode 3a facing the operation region 2 touched with the finger, and the high frequency signal is bypassed to the earth through a human body. The electrostatic capacitance between the key electrode 3a and the earth thus becomes large compared to when the finger is not touched, that is, the impedance between the key electrode 3a and the earth becomes small compared to when the finger is not touched, and thus the voltage of the high frequency signal output to the key electrode 3a is decreased. The control unit 8 judges that the touch key 13 is pushed when the voltage of the key electrode 3a is decreased to less than or equal to a predetermined voltage, and controls the conduction to the heating coil 10 based on the control command assigned to the touch key 13. For instance, start and stop of heating, adjustment of heating power, and the like are performed according to the control command input to the touch key 13.

In the present specification, the wordings "push down", "push", and "operate" for the touch key 13, the key electrode 3a, the contact electrode 3b, and a cancel electrode 5a are all used in a similar meaning, and mean touching the surface portion of the top plate 1 facing each electrode for input operation. The wording "vicinity" used for the key electrode 3a, the contact electrode 3b, and the cancel electrode 5a means the surface portion of the top plate 1 facing each electrode.

Since the key electrode 3a configuring the touch key 13 is connected to the contact electrode 3b, when the user touches the upper surface of the top plate 1 facing the contact electrode 3b, the voltage of the electrode unit 3 including the key electrode 3a and the contact electrode 3b is decreased, similar to the case where the operation region 2 is touched, and the control unit 8 may judge that the control command has been input. Thus, in order to perform a control so as not to operate according to the control command assigned to the electrode unit 3 when the upper surface of the top plate 1 facing the contact electrode 3b excluding the operation region 2 is touched, the cancel electrode 5a is provided at the lower surface of the top plate 1 and at the periphery of the contact electrode 3b. The control unit 8 and the cancel electrode 5a are electrically connected by a conductive connection member 7 different from the connection member 6.

Figure 3:
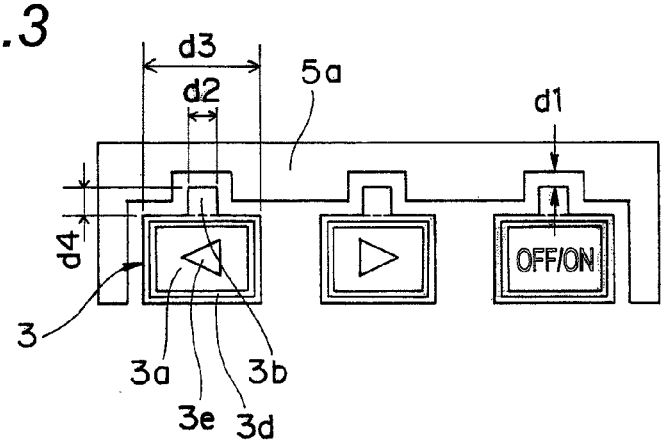
FIG. 3 shows shapes of a key electrode, a contact electrode, and a cancel electrode of the first embodiment of the present invention.

FIG. 3 shows a planar shape of the cancel electrode 5a, and the key electrode 3a and the contact electrode 3b configuring the electrode unit 3. The cancel electrode 5a is provided at the periphery of the contact electrodes 3b connected to each key electrode 3a so as to surround the contact electrodes 3b, and is provided to surround both sides of a group of key electrodes 3a lined on the same line as well as the heating coil 10 side. A distance d1 between the contact electrode 3b and the cancel electrode 5a is formed to be smaller than a width (about 7 to 10 mm) of the contacting portion of the finger of a standard adult and the top plate 1 when the finger of the user touches the top plate 1. Thus, when the upper surface of the top plate 1 at the edge of the contact plate 3b is touched, the vicinity of the upper surface of the top plate 1 facing the cancel electrode 5a is touched at the same time. A width d2 of the contact electrode 3b or a length d4 of the contact electrode and the distance d1 are preferably set such that the upper part or the vicinity of the upper part of the cancel electrode 5a is touched when the upper surface of the top plate 1 at the upper part of the contact electrode 3b is touched at a position where the upper surface of the top plate 1 at the upper part of the key electrode 3a is clearly judged as not being touched, and the touching of the cancel electrode 5a can be detected. The cancel electrode 5a can more easily detect the approach of the finger when the vicinity of the contact electrode 3b is touched the shorter the width d2 or the length d4 of the contact electrode 3b. For instance, d1 can be set to 2 mm, and d2 can be set to 3 mm. Furthermore, d1 can be set to 2 mm, and d4 can be set to 3 mm. When the upper surface of the top plate 1 facing at least an outer peripheral portion (exclude connecting portion with the key electrode 3a) of the contact electrode 3b is touched, the upper surface of the top plate 1 facing the cancel electrode 5a is also touched at the same time, and thus the control unit 8 detects that the upper surface of the top plate 1 at the upper part of the contact electrode 3b is touched and controls the operation of the touch key 13 so that the user does not feel an uncomfortable feeling. In the present embodiment, a distance between the key electrode 3a and the cancel electrode 5a is also formed to be smaller than the width of the contacting portion of the finger of the user and the top plate 1. The relevant distance is, for example, 2 mm. The range of the operation region 2 thus can be specifically set. The contact electrode 3b does not need to be provided at substantially the central part (substantially central part of the width d3) at the side on the heating coil 10 side of the key electrode 3a, and may be provided at positions deviated to the left or the right.

The key electrode 3a, the contact electrode 3b, and the cancel electrode 5a provided on the lower surface of the top plate 1 are made of conductive substance such as copper and carbon, and are formed by an application film of conductive paint, screen printing film, or metal vapor deposited film.

Similarly for the cancel electrode 5a, the control unit 8 applies a high frequency voltage, and judges that the upper surface of the top plate 1 facing the cancel electrode 5a is pushed when detecting reduction of the voltage of the cancel electrode 5a to lower than or equal to a predetermined voltage or reduction of voltage by greater than or equal to a predetermined voltage difference. When detecting that the upper surface of the top plate 1 facing the cancel electrode 5a and the contact electrode 3b is simultaneously pushed, the control unit 8 limits the operation based on the control command transmitted from the key electrode 3a connected to the contact electrode 3b. In the present embodiment, specifically, the operation based on the control command is limited by invalidating the conduction to the heating coil 10 based on the control command.

As shown in FIG. 1, the induction cooking device of the present embodiment also includes an informing unit 12. When the control command is invalidated as a result of the simultaneous pushing of the key electrode 3a and the cancel electrode 5a, the informing unit 12 informs such fact in an annunciation mode different from the usual annunciation mode. The informing unit 12 is, for example, an audio informing device that generates buzzer or voice.

1.2 Operation of Induction Cooking Device

The operation of the induction cooking device of the present embodiment configured as above will now be described. FIG. 4 is a flowchart of the operation executed by the control unit 8. The control unit 8 determines whether or not the cancel electrode 5a is pushed (S101). Specifically, the control unit 8 detects the voltage of the cancel electrode 5a, and judges that the upper surface of the top plate 1 facing the cancel electrode 5a is pushed when the voltage of the cancel electrode 5a is lower than a predetermined voltage. The control unit 8 may detect the voltage of the cancel electrode 5a, and may judge that the upper surface of the top plate 1 facing the cancel electrode 5a is pushed when the voltage of the cancel electrode 5a is lower than the voltage of when the upper surface of the top plate 1 facing the cancel electrode 5a is not pushed in excess of greater than or equal to a predetermined voltage difference.

When the cancel electrode 5a is pushed, the control unit 8 judges whether or not the control command is input (S102). Specifically, the control unit 8 judges whether or not the voltage of the electrode unit 3 is lower than a predetermined voltage, and determines that the control command is input from the electrode unit 3 when the voltage of the electrode unit 3 is lower than the predetermined voltage. The control unit 8 may detect the voltage of the electrode unit 3, and may judge that the upper surface of the top plate 1 facing the electrode unit 3 is pushed when the voltage of the electrode unit 3 is lower than the voltage of when the upper surface of the top plate 1 facing the electrode unit 3 is not pushed in excess of greater than or equal to a predetermined voltage difference.

If the control command is input from the electrode unit 3 simultaneously with the pushing of the cancel electrode 5a, such control command is invalidated (S103). For instance, if the control command for raising the heating power is input, the heating coil 10 is controlled so as not to raise the heating power according to the relevant control command. If the control command is not input simultaneously with the pushing of the cancel electrode 5a in step S102, no process is performed, and the process returns to step 101.

If the cancel electrode 5a is not pushed in step S101, the control unit 8 judges whether or not the control command is input from the electrode unit 3 (S104). If the control command is input, such control command is validated (S105). In other words, the control unit 8 conduction controls the heating coil 10 according to the control command. The control unit 8 may measure the time of continuing to validate the input operation of the control command from the electrode unit 3, and may prohibit the execution of the conduction control on the heating coil 10 according to the control command if the continued time is shorter than a predetermined time (e.g., 0.1 seconds) or may execute the conduction control on the heating coil 10 according to the control command if the continued time is longer than or equal to the predetermined time. The control circuit 8 may judge whether or not the voltage of the electrode unit 3 is lower than a predetermined voltage in step S104, and may judge that the control command is input from the electrode unit 3 when the voltage of the electrode unit 3 is continuously lower than the predetermined voltage for the predetermined time (e.g., 0.1 seconds). Similarly, the control unit 8 may detect the voltage of the electrode unit 3, and judge that the control command is input from the electrode unit 3 when the voltage of the electrode unit 3 is continuously lower than the voltage of when the upper surface of the top plate 1 facing the electrode unit 3 is not pushed by greater than or equal to a predetermined voltage difference for the predetermined time (e.g., 0.1 seconds). In this case, steps 102 and 103 are omitted, and if the cancel electrode 5a is pushed in step S101, no process is performed, and the process returns to step 101. The conduction control on the heating coil 10 according to the control command is executed at the time point when the control command is validated in step 105.

Therefore, the induction cooking device of the present embodiment judges that the operation region 2 of the touch key 13 is operated when the control command from the electrode unit 3 is input unless the control unit 8 judges that the upper surface of the top plate 1 facing the cancel electrode 5a is pushed and conduction controls the heating coil 10 according to the input control command. If the control unit 8 judges that the upper surface of the top plate 1 facing the cancel electrode 5a is pushed, judgment is made that the operation region 2 of the touch key 13 is not operated even if the control command from the electrode unit 3 is input, and the operation setting of the heating source according to the control command from the electrode unit 3 is not changed, and the operation of the heating source is continued as before.

1.3 Summary

The user places the object to be heated 4 on the top plate 1 provided at the upper surface of the device, and touches the operation region 2 formed at the surface portion (hereinafter referred to as "vicinity of the key electrode") of the top plate 1 facing the key electrode 3a to input the control command when heat cooking. However, if the upper surface portion (hereinafter referred to as "vicinity of the contact electrode") of the top plate 1 facing the contact electrode 3b other than the operation region 2 is touched, the impedance of the electrode unit 3 lowers and the voltage of the high frequency signal applied by the control unit 8 reduces compared to when such portion is not touched, similar to the case where the operation region 2 is touched, and thus detection is made as being touched, and the control command might be transmitted to the control unit 8. According to the present embodiment, since the cancel electrode 5a is provided at a position where the distance between the contact electrode 3b and the cancel electrode 5a becomes smaller than the contacting portion of the finger of a standard adult and the top plate 1, the upper surface of the top plate 1 facing the contact electrode 3b outside the range of the operation region 2 and the upper surface of the top plate 1 facing the cancel electrode 5a can be simultaneously touched with the finger. In order to increase the portion to be simultaneously touched, the distance may be appropriately narrowed. The distance is preferably greater than or equal to 0.5 mm, and more preferably greater than or equal to 1 mm. It may be set in view of the variation in printing and interference between the electrodes. Since the impedance with respect to the earth of both the contact electrode 3b and the cancel electrode 5a becomes small and the voltage of the high frequency signal reduces when the contact electrode 3b and the cancel electrode 5a are simultaneously touched with the finger, the control unit 8 may judge that the user has not operated the touch key 13 when detecting that the vicinity of the cancel electrode 5a is touched. Therefore, when the voltage of the electrode unit 3 becomes smaller than or equal to a predetermined voltage without the intension of the user, the operation according to the control command assigned to the touch key 13 is not performed. According to such control, the induction cooking device of the present embodiment performs the conduction control on the heating coil 10 only when recognizing that the user has touched the operation region 2 of the touch key 13. When the outside of the range of the operation region 2 of the touch key 13 is clearly touched, the control command is prevented from being input, the control operation is prevented from being performed, and the user is prevented from feeling uncomfortable. Since the range of the operation region 2 of the touch key 13 is specified, the user can easily operate the touch key 13.

The user is prevented from mistakenly recognizing that the touch key 13 is malfunctioning by notifying the user that the operation of the touch key 13 is invalidated by the informing unit 12.

Furthermore, since the cancel electrode 5a is also provided at the periphery of the key electrode 3a, when some kind of conductive object is placed on one of the operation regions 2, the same object often exists on the upper surface of the top plate 1 facing the cancel electrode 5 provided at the vicinity of the corresponding key electrode 3a. Thus, when a cooker and the like are placed with the hand touching the operation region 2 of the touch key 13, or when the hand touches the attached spill-out from the pan, water or the like or when the user wipes the spill-out and the like from the pan with a cloth thereby touching the operation region 2, the operation of the touch key 13 detected as being simultaneously touched with the cancel electrode 5a may be invalidated or the operation of the touch key 13 may become hard to be accepted. Thus, the heating can be continued without performing the operation unintended by the user, and the safety and the convenience of the user can be enhanced.

When operating the operation region 2 with a finger, such region is touched with a finger tip and the entire finger is positioned diagonally inclined to the near side as shown in FIG. 1, and thus the near side thereof contacts more to the top plate 1 and the degree of proximity increases. However, according to the present embodiment, the upper surface of the top plate 1 facing the cancel electrode 5a is prevented from being mistakenly touched when operating the operation region 2 of the touch key 13 by arranging the cancel electrode 5a with the user side opened, that is, by not arranging the cancel electrode 5a on the user side of the key electrode 3a. Since the operation region 2 is provided on the near side (user side) of the top plate 1 so as to be easily operated by the user, the cancel electrode 5a is not unintentionally touched or approached in time of operation.

If the cancel electrode 5a is provided to surround the entire operation region 2 including the user side, the cancel electrode 5a becomes too close to a metal frame 11. The frame 11 is connected to the earth, and thus the voltage of the cancel electrode 5a remains low if the cancel electrode 5a is close to the metal frame 11, and the control unit 8 may mistakenly judge that that cancel electrode 5a is remained pushed. However, according to the present embodiment, the cancel electrode 5a does not become close to the frame 11 and the voltage of the cancel electrode 5a will not remain low since the cancel electrode 5a is provided with the user side opened. When arranging the cancel electrode 5a on the user side of the key electrode 3a, the distance between the cancel electrode 5a and the key electrode 3a on the user side is preferably larger than the distance between the cancel electrode 5a and the key electrode 3a on the heating coil 10 side.

1.4 Variant

In the present embodiment, the cancel electrode 5a is provided so as to surround the key electrode 3a and the contact electrode 3b with the user side opened, but merely needs to be provided so as to surround at least the contact electrode 3b. If the cancel electrode 5a is provided so as to surround at least the contact electrode 3b, the false operation of when the outside of the operation region 2 of the touch key 13 on the top plate 1 is touched can be prevented.

In the present embodiment, the control unit 8 invalidates the control command transmitted from the electrode unit 3 (step 103 of FIG. 4) when the cancel electrode 5a and the electrode unit 3 are simultaneously pushed, but the control command may not be invalidated and may be changed such that the effectiveness of the touch key 13 when the cancel electrode 5a and the electrode unit 3 are simultaneously pushed is less effective compared to the effectiveness when the cancel electrode 5a and the electrode unit 3 are not simultaneously pushed. The operation based on the control command is limited as the touch key 13 becomes less effective. The effects similar to the present embodiment then can be obtained.

In this case, when judging whether or not the touch key 13 is pushed based on whether or not the voltage of the electrode unit 3a is smaller than a predetermined voltage (key input detection reference value) or the reference of the key push detection level, the predetermined voltage which is the key input detection reference value is changed to be low when the cancel electrode 5a is pushed compared to when it is not pushed. For instance, the first predetermined voltage and the voltage of the electrode unit 3 are compared when the cancel electrode 5a is not pushed, and the seconds predetermined voltage lower than the first predetermined voltage and the voltage of the electrode unit 3 are compared when the cancel electrode 5a is pushed. Thus, when the cancel electrode 5a is pushed, the predetermined voltage (key input detection reference value) which is the judgmental standard is set to a low value, so that the touch key 13 is less effective.

When judging whether or not the touch key 13 is pushed based on whether the voltage of the electrode unit 3a is lowered by greater than or equal to a predetermined voltage reduction amount (key input detection reference value) which is the reference of the key push detection level compared to when the cancel electrode 5a is not pushed, the predetermined voltage reduction amount which is the key input detection reference value is changed so as to be large when the cancel electrode 5a is pushed compared to when it is not pushed. For instance, the first predetermined voltage reduction amount and the voltage reduction amount of the electrode unit 3 are compared when the cancel electrode 5a is not pushed, and the second predetermined voltage reduction amount larger than the first predetermined voltage reduction amount and the voltage reduction amount of the electrode unit 3 are compared when the cancel electrode 5a is pushed. Thus, when the cancel electrode 5a is pushed, the predetermined voltage reduction amount (key input detection reference value) which is the push judgmental standard of the electrode unit 3 is set to a large value compared to when it is not pushed, so that the touch key 13 is less effective.

The output voltage to the electrode unit 3 changes by the area of the contacting portion of the operation region 2 of the touch key 13 and the finger of the user, and the greater the area of the contacting portion is, the more the voltage of the electrode unit 3 is decreased. Thus, when the user is touching the operation region 2 of the touch key 13 by design, that is, when the area of the contacting portion of the finger of the user and the operation region 2 of the touch key 13 is large, the voltage of the electrode unit 3 becomes lower than or equal to the second predetermined voltage of low voltage value or greater than or equal to the second predetermined voltage reduction amount of large reduction amount. The control unit 8 then can judge that the touch key 13 is pushed by design. When the area of the contacting portion of the finger of the user and the operation region 2 of the touch key 13 is small, the voltage of the electrode unit 3 does not reach lower than or equal to the second predetermined voltage of low voltage value. The control unit 8 then can judge that the touch key 13 is not pushed by design. Thus, according to the pushed state of the cancel electrode 5a, the touch key 13 is changed so as to be less effective by changing the key input detection reference value of the electrode unit 3 so as to be less likely to be accepted when the cancel electrode 5a is pushed than when the cancel electrode 5a is not pushed, whereby the false operation of when the region other than the operation region 2 is touched is prevented.

The changing of the key input detection reference value may be carried out between step 101 and step 102 of FIG. 4. In other words, the touch key 13 is made to be less effective by changing the key input detection reference value when judged that the cancel electrode 5a is pushed. If still judged that the touch key 13 is pushed, the control command by the pushed touch key 13 may be invalidated. In annunciating the invalidation due to the simultaneous pushing of the cancel electrode 5a and the touch key 13, the opportunity of making such annunciation can be reduced.

Similarly, the predetermined voltage (cancel input detection reference value) which is the cancel detection level for judging whether or not the upper surface of the top plate 1 facing the cancel electrode 5a is pushed may be changed based on the state of the touch key 13, and the cancel electrode 5a may be made to be less effective when the touch key 13 is pushed compared to when the touch key 13 is not pushed. In annunciating when the cancel electrode 5a and the touch key 13 are simultaneously pushed, the opportunity of making such annunciation can be reduced.

In the present embodiment, it has been described that the control com d transmitted from the key electrode 3a connected to the contact electrode 3b is invalidated when detecting that the cancel electrode 5a and the contact electrode 3b are simultaneously push-operated, that is, when detecting that the upper surface of the top plate 1 facing the cancel electrode 5a and the contact electrode 3b is simultaneously touched, but the control command may be invalidated, not limited to when the cancel electrode 5a and the contact electrode 3b are simultaneously touched, but also when they are not simultaneously touched. Specifically, it is assumed that the cancel electrode 5a and the contact electrode 3b are simultaneously contacted when detecting that the contact electrode 3b is touched within a predetermined time (e.g., 0.5 seconds) from when detecting the change in a state of the cancel electrode 5a from being touched to not being touched, and/or, when detecting that the cancel electrode 5a is touched within a predetermined time (e.g., 0.5 seconds) from when detecting the change in a state of the contact electrode 3b from being touched to not being touched, and the control command transmitted from the key electrode 3a connected to the contact electrode 3b may be invalidated or the touching of the vicinity of the key electrode 3a within a predetermine time after switched to the state in which the cancel electrode 5a is not touched may be less likely to be detected. Similar effects are also obtained.

The shape of the outer edge of the electrode unit 3 including the key electrode 3a and the contact electrode 3b may not be a projecting shape. For instance, it may be rectangular or square. The shape merely needs to allow the cancel electrode 5a to be provided in the vicinity of the contact electrode 3b contacting the connection member 6. If the contact electrode 3b contacting the connection member 6 is provided more distant than the position shown in FIG. 3, that is, if provided such that d4 of FIG. 3 becomes long, the action of the cancel electrode 5a is preferably made larger by having the width of the connection wiring portion with the electrode unit 3a on the electrode unit 3a side narrower than the width d2 near the portion contacting the connection member 6 to a constricted shape.

Regarding the symbols and characters indicating the control command assigned to the touch key 13, the symbols and characters may be printed in the operation region 2 of the upper surface or the lower surface of the top plate 1 instead of the configuration of cutting out the key electrode 3a and irradiating the light bf the light source 9 from the lower side so that the symbols and characters come out.

In the present embodiment, the light source 9 is provided on the lower side of the key electrode 3a, but the light source 9 may be omitted. In this case as well, the key electrode 3a can be easily provided on the near side by arranging the contact electrode 3b on the back side of the key electrode 3a.

In the present embodiment, the key electrode 3a configuring the touch key 13 is provided on the lower surface of the top plate 1, but an electrode facing the key electrode 3a may also be provided on the upper surface of the top plate 1. Similarly, the cancel electrode 5a is provided on the lower surface, but the cancel electrode 5a may be formed by a pair of electrodes provided on both the upper surface and the lower surface of the top plate 1.

The top plate 1 may be formed by a light transmissive electrical insulation object such as crystallized ceramics instead of glass.

The informing unit 12 is not limited to a buzzer or an audio informing device, and may be a display device of liquid crystal etc., a light source such as LED, or a device for generating vibration.

The cooking device of the present embodiment detects the touching of the operation unit using the electrostatic capacitance touch key for detecting the output voltage of the high frequency signal output to the key electrode and the cancel electrode and detecting the voltage value or the voltage reduction amount thereof, but the present invention can also be applied to a case in which the operation is detected using the electrostatic touch key of other methods. Whether or not the cancel electrode is touched is detected similarly using the configuration of the electrostatic touch key of other methods.

The cooking device of the present embodiment has a configuration of detecting that the electrode unit 3 is touched with the finger when the impedance between the electrode unit 3 and the earth is lowered compared to when not touched with the finger, and detecting that the cancel electrode 5a is touched with the finger when the impedance between the cancel electrode 5a and the earth is lowered compared to when not touched with the finger, but the configuration of detecting that the vicinity of the electrode unit 3 is touched with the finger and the configuration of detecting that the vicinity of the cancel electrode 5a is touched with the finger are not limited thereto. For instance, a common electrode connected to the common potential of the control unit 8 may be formed in the vicinity of the electrode unit 3, and the detection that the electrode unit 3 is touched may be made by detecting the increase in the electrostatic capacitance between the electrode unit 3 and the common electrode. Similarly, a common electrode connected to the common potential of the control unit 8 may be formed in the vicinity of the cancel electrode 5a, and the detection that the cancel electrode 5a is touched may be made by detecting the increase in capacitance between the cancel electrode 5a and the common electrode.

The cooking device of the present invention can prevent false operation of when the region other than the operation region of the touch key in the vicinity of the conductive connecting portion provided to connect the key electrode such as the contact electrode and the control unit is touched, and thus it is useful in the cooking device having a configuration in which the control command input to the electrostatic touch key provided on the upper surface of the main body is transmitted to the control unit via the contact electrode. In the present embodiment, the induction cooking device using the heating coil as the heating source has been described, but the configuration and the control of the touch key of the present invention are adaptable to the cooking device, which includes a heating source other than the heating coil, having the touch key on the upper surface of the device. For instance, the present invention can be applied to a gas cooking device using a gas burner as the heating source, a halogen cooking device using a halogen lamp as the heating source, a heater cooking device using a radiant or a sheath heater as the heating source, and the like.

<<Second Embodiment>>

An induction cooking device of the second embodiment of the present invention has a function of preventing false operation when mistakenly judged that the touch key is pushed when the user touches the touch key to wipe the spill-out from the object to be heated and the like with cloth etc., while heating the object to be heated.

2.1 Configuration of Induction Cooking Device

FIG. 5 shows a configuration of an induction cooking device of the second embodiment of the present invention. In FIG. 5, the same reference numerals are denoted for the same components as in FIG. 1, and the description will not be repeated. The induction cooking device of the present embodiment differs from the first embodiment in the configuration of the electrode of the touch key 13, and also in that the contact electrode 3b is not provided and the light source 9 is not provided. Since the contact electrode 3b is not provided, the shape of the cancel electrode 5b also differs from the cancel electrode 5a of the first embodiment. The configuration different from the first embodiment will be specifically described below.

In the present embodiment, an operation electrode 3c is provided on the upper surface of the top plate 1, and the key electrode 3a is provided on the lower surface of the top plate 1 facing the operation electrode 3c. The pair of electrodes 3c, 3a provided on the upper surface and the lower surface of the top plate 1 configures the electrostatic capacitance touch key 13. The operation electrode 3c is provided to obtain a stable operation sensitivity, but may be omitted. In this case, the operation region is printed and displayed on the upper surface of the top plate facing the key electrode 3a. The key electrode 3a provided on the lower surface of the top plate 1 has the other end directly contacting the conductive connection member (not shown) connected to the control unit 8 similar to the connection member 3b of FIG. 1, and is electrically connected to the control unit 8. The configuration of the contact electrode 3b of FIG. 1 may be adopted to achieve the electrical connection.

The control unit 8 is connected to a commercial power supply and includes an operation detection circuit 8c. The operation detection circuit 8c includes an oscillation circuit (not shown) for applying an alternating current (AC) signal of high frequency to the key electrode 3a facing the operation electrode 3c, a rectifier circuit (not shown) for inputting and rectifying the voltage applied to the operation electrode 3c, and a voltage detection circuit (not shown) for measuring the voltage of the rectifier circuit. The common potential of the operation detection circuit 8c is connected to the earth by means of a series circuit of a resistor 8a and a capacitor 8b. When the finger of the user touches the operation electrode 3c provided on the upper surface of the top plate 1, a path of the high frequency current that flows from the electrode 3a to the earth bypassing the human body is formed. In other words, the impedance between the electrode 3a and the earth lowers (the capacitance value is increased). Thus, the impedance between the key electrode 3a and the earth is lowered, the voltage of the AC signal output to the key electrode 3a is decreased, and the signal by such voltage is transmitted to the control unit 8. The control unit 8 converts the signal to a direct current (DC) voltage by means of the operation detection circuit 8c, and detects the reduction amount of such level. Thus, the control unit 8 detects that the touch key 13 is pushed (operated) when the reduction amount from the detection voltage of when the touch key 13 is not touched becomes greater than or equal to a predetermined value, and executes the control command assigned to the pushed touch key 13 to control the conduction to the heating coil 10.

Figure 7A:
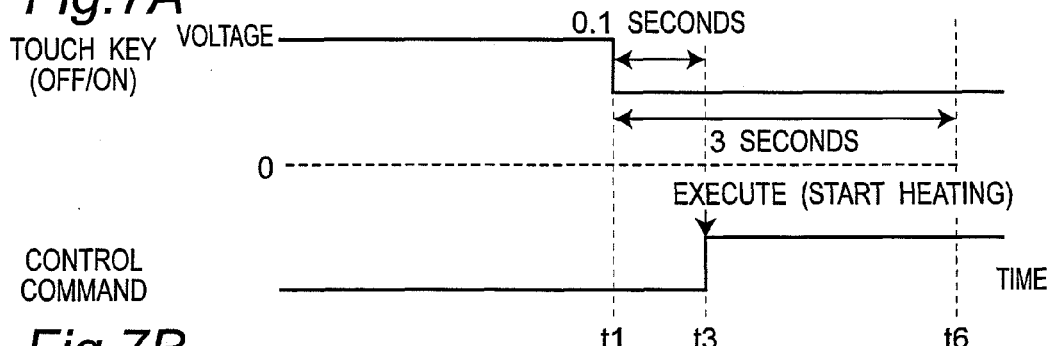
FIGS. 7A, 7B, 7C, and 7D are waveform charts of the detection signals of the touch key and the cancel electrode of the second embodiment of the present invention.

When the touch key 13 is pushed, the control unit 8 measures the time in which the pushed state is continued, and controls the conduction to the heating coil 10 to execute the assigned control command when the measurement time reaches a predetermined time (first predetermined time, e.g., 0.1 seconds) (FIG. 7A). For instance, the control unit 8 starts the heating operation of the heating coil 10 when 0.1 seconds has elapsed (time point t3 of FIG. 7A) after detecting that off/on key 13c is pushed (time point t1 of FIG. 7A) while heating is stopped.

Figure 7B:
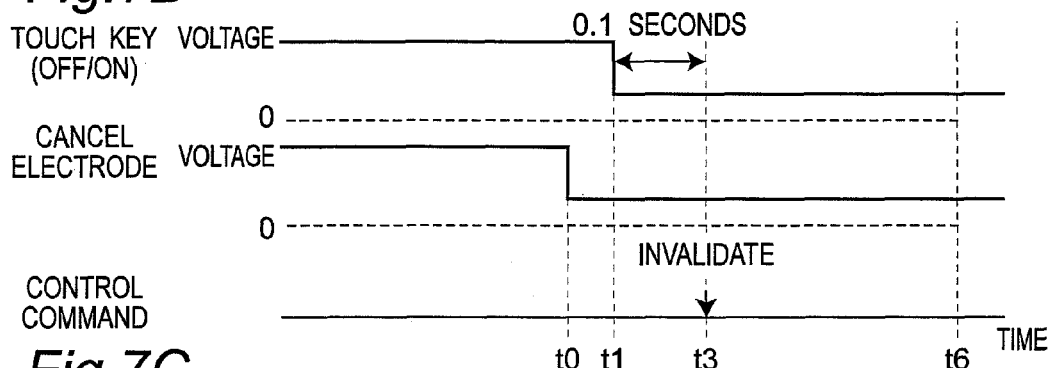
Figure 7C:
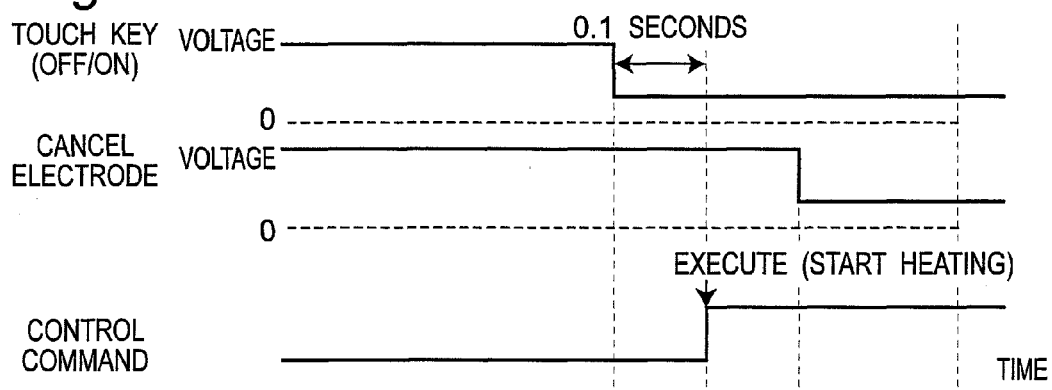
Figure 7D:
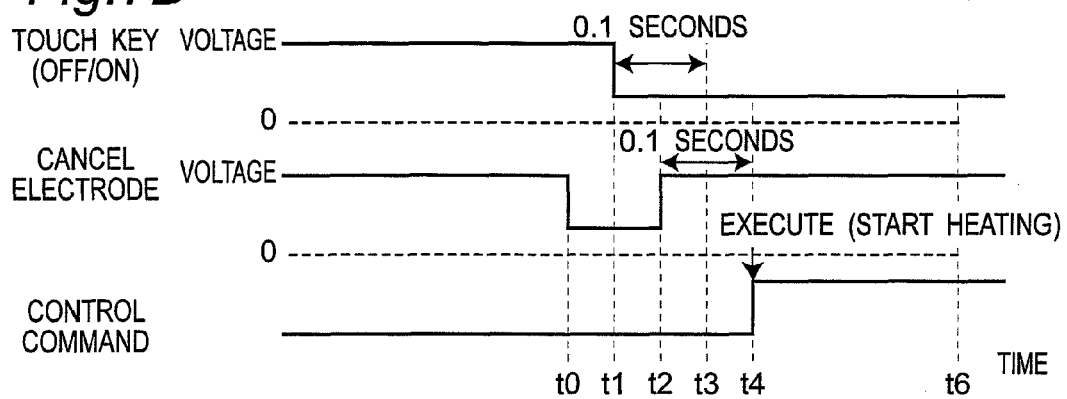

As shown in FIG. 5, the induction cooking device of the present embodiment includes the cancel electrode 5b at the lower surface of the top plate 1 and in the vicinity of the touch key 13. The operation detection circuit 8c of the control unit 8 outputs the AC signal to the cancel electrode 5b. When the finger of the user, the cooker placed on the top plate 1 while being held by the user with hand, the water spilled out onto the top plate 1 and touched the frame 11 at the earth potential, or the like touches the upper surface of the top plate 1 facing the cancel electrode 5b, the output voltage to the cancel electrode 5b is decreased (FIGS. 7B to 7D). When detecting that the reduction amount of the voltage is greater than or equal to a predetermined amount, the control unit 8 detects that the upper surface of the top plate 1 in the vicinity of the cancel electrode 5b is touched. When detecting that the upper surface of the top plate 1 facing the cancel electrode 5b and the operation electrode 3c of the touch key are simultaneously touched, the control unit 8 invalidates the control command for changing the conduction state of the heating coil 10 by the operation of the relevant touch key. The details on the operation of when the cancel electrode 5b is pushed will be hereinafter described.

The operation electrode 3c and the key electrode 3a configuring the touch key 13, and the cancel electrode 5b are made of conductive material such as an application film of conductive paint, screen printing film, metal vapor deposited film, or the like. The operation electrode 3c, the key electrode 3a, and the cancel electrode 5b may be formed by laminating a flexible printed-wiring board made from copper foil along with the connection wiring to the lower surface of the top plate with an adhesive material, and may be connected to the control unit 8. The operation electrode 3c, the key electrode 3a, and the cancel electrode 5b may be formed from copper foil along with the connection wiring on the printed-wiring board, and may be connected to the control unit 8 by being pressed against the lower surface of the top plate 1.

FIG. 6 is a plan view of the top plate 1 provided on an upper surface 20 of the induction cooking device of the present embodiment shown in FIG. 5. A heating unit 14 indicating the location to place the object to be heated is displayed on the upper surface or the lower surface of the top plate 1. The heating unit 14 is displayed by forming a print film to a circular shape at the position corresponding to the heating coil provided on the lower side. In FIG. 6, two heating units 14 are provided, and an operation unit 130 is provided to correspond to each heating unit 14.

Each operation unit 130 is configured by a plurality of touch keys 13a to 13c. The touch keys 13a to 13c have the configuration of the touch key 13 shown in FIG. 15, and is configured by a pair of electrodes 3a and 3c. The plurality of touch keys 13a to 13c are assigned with a control command for controlling the start/stop of heating and up/down of heating power. The operation unit 130 is provided in front of the heating unit 14, that is, on the user side so as to be easily operated by the user.

The cancel electrode 5b is provided to correspond to the operation unit 130 and is provided to surround the operation unit 130 at both sides of the operation unit 130 and at the heating coil 10 side (far side) while opening the near side (user side) of the top plate, and thus is formed to a horseshoe shape when seen from above.

An operation display window 15, which is a non-painted region where the light shielding paint is not painted and through which heating power setting display and the like are displayed, is provided to include the operation unit 130 and the cancel electrode 5b. The operation display window 15 is printed with a black light transmissive film. Other than the operation display window 15, the upper surface or the lower surface of the top plate 1 that does not need to transmit light from the lower side is painted or printed with colored paint so that the heating coil 10 and the like provided on the lower side of the top plate 1 cannot be seen.

In the induction cooking device configured as above, when the portion facing the cancel electrode 5b and the portion facing the key electrode 3a of the top plate 1 are wiped with a cloth and the like while the heating coil 10 heats the object to be heated 4, the voltage of the cancel electrode 5b changes almost simultaneously with the key electrode 3a. When detecting that the voltage of the cancel electrode 5b is simultaneously changed, the control unit 8 controls the induction cooking device so as not to change the operation setting of the heating coil 10 according to the control command assigned to the key electrode 3a of the touch key 13, the voltage of which is judged to have simultaneously changed with the cancel electrode 5b.

When water attached across the touch keys 13a to 13c during heating due to spill-out from the object to be heated 4 and the like, and the touch key 13 is wiped with a cloth and the like, the voltage of the plurality of key electrodes 3a of the touch key 13 simultaneously changes. The induction cooking device of the present embodiment also performs a control so as not to operate according to the control command assigned to the touch keys 13 when judged that two or more touch keys 13 are simultaneously pushed. The operation of the induction cooking device will be described below using FIG. 7 and FIG. 8.

2.2 Operation of Induction Cooking Device

FIGS. 7A to 7D show waveforms of the detection signals of the touch key and the cancel electrode indicating the output voltage change of the rectifier circuit in the operation detection circuit 8c of the control unit 8. In FIGS. 7A to 7D, the horizontal axis indicates time, and the vertical axis of the touch key and the cancel electrode indicates voltage value. The vertical axis of the control command schematically shows whether or not the conduction control to the heating coil 10 is changed (whether or not the control command is executed or invalidated) by High and Low state based on the control command assigned to the touch key.

FIG. 7A shows the timing in which the control command is executed when the touch key 13 is pushed. The operation detection circuit 8c detects that the touch key 13 is operated when the reduction amount from the detection voltage of when the touch key 13 is not touched becomes greater than or equal to a predetermined value (time point t1). The control unit 8 measures the time in which the operation state is continued from when the touch key 13 is operated, and performs a control so as to change the operation state of the heating coil 10 according to the control command assigned to the pushed touch key when the measured time reaches the first predetermined time (e.g., 0.1 seconds) (time point t3). For instance, if the cancel electrode 5b is not pushed after detecting that the off/on key 13c is pushed while heating is stopped, the heating operation of the heating coil 10 starts when the pushing of the off/on key 13c is continuously detected for 0.1 seconds. Furthermore, after detecting that the off/on key 13c is pushed during the heating operation, when the pushing is continuously detected for 0.1 seconds, the heating of the heating coil 10 is stopped.

FIG. 7B shows a case where the control command is invalidated when the touch key 13 is pushed while the cancel electrode 5b is being pushed. In other words, FIG. 7B shows a case where the cancel electrode 5b is pushed simultaneously with the touch key by pushing the cancel electrode 5b before one of the touch keys 13a to 13c is pushed (time point t0). When detecting that the voltage reduction amount of the cancel electrode 5b is greater than or equal to a predetermined amount, the operation detection circuit 8c detects that the upper surface of the top plate 1 in the vicinity of the cancel electrode 5b is touched (time point t0). When detecting that the upper surface of the top plate 1 facing the cancel electrode 5b is touched, the control unit 8 continues the heating operation of the heating coil 10 of when detecting that the cancel electrode 5b is pushed. Furthermore, the control unit 8 controls such that the conduction state to the heating coil 10 based on the control command input to the touch key 13 cannot be changed while the upper surface of the top plate 1 facing the cancel electrode 5b is being touched. Thus, even if the pushing of the touch key 13 is detected (time point t1), and a state of detecting the pushing is continued for the first predetermined time (e.g., 0.1 seconds) from when the pushing of the touch key is detected, the control unit 8 does not execute the control command assigned to the relevant touch key (time point t3).

FIG. 7C shows a state in which the touch key 13 is pushed and the control command is executed before the cancel electrode 5b is pushed. When detecting that the upper surface of the top plate 1 facing the cancel electrode 5b is touched (time point t5), the control unit 8 continues the operation based on the executed control command to continue the conduction state of the heating coil 10 upon the detection (time point t5). In other words, when the cancel electrode 5b is pushed (time point t5) after the first predetermined time has elapsed from when the pushing of one of the touch keys 13a to 13c is detected, the cancel electrode 5b becomes simultaneously pushed with the touch key. In this case, the heating operation of the heating coil 10 of when detecting that the cancel electrode 5b is pushed is continued for the touch key that is in a state simultaneously pushed with the cancel electrode 5b, and the control command assigned to the relevant touch key of after being in the simultaneously pushed state is not executed.

FIG. 7D shows a waveform of when the touch key 13 is pushed while the cancel electrode 5b is pushed, and thereafter the cancel electrode 5b is returned to the non-pushed state. The cancel electrode 5b is in the pushed state at the time point (time point t1) at which the touch key 13 is pushed, and thus judgment is not made that the touch key 13 is pushed during the time point t1 to t2, and the control command is not executed even after 0.1 seconds has elapsed from when the touch key 13 is pushed (time point t3). However, the control command is executed (time point t4) after 0.1 seconds has elapsed from when the cancel electrode 5b is returned to the non-pushed state. In other words, when it is judged that any of the touch keys 13a to 13c is pushed (time point t2) and a non-pushed state of the cancel electrode 5b has elapsed for the first predetermined time, the control command assigned to the any of the touch keys 13a to 13c is executed (time point t4).

Figure 8:
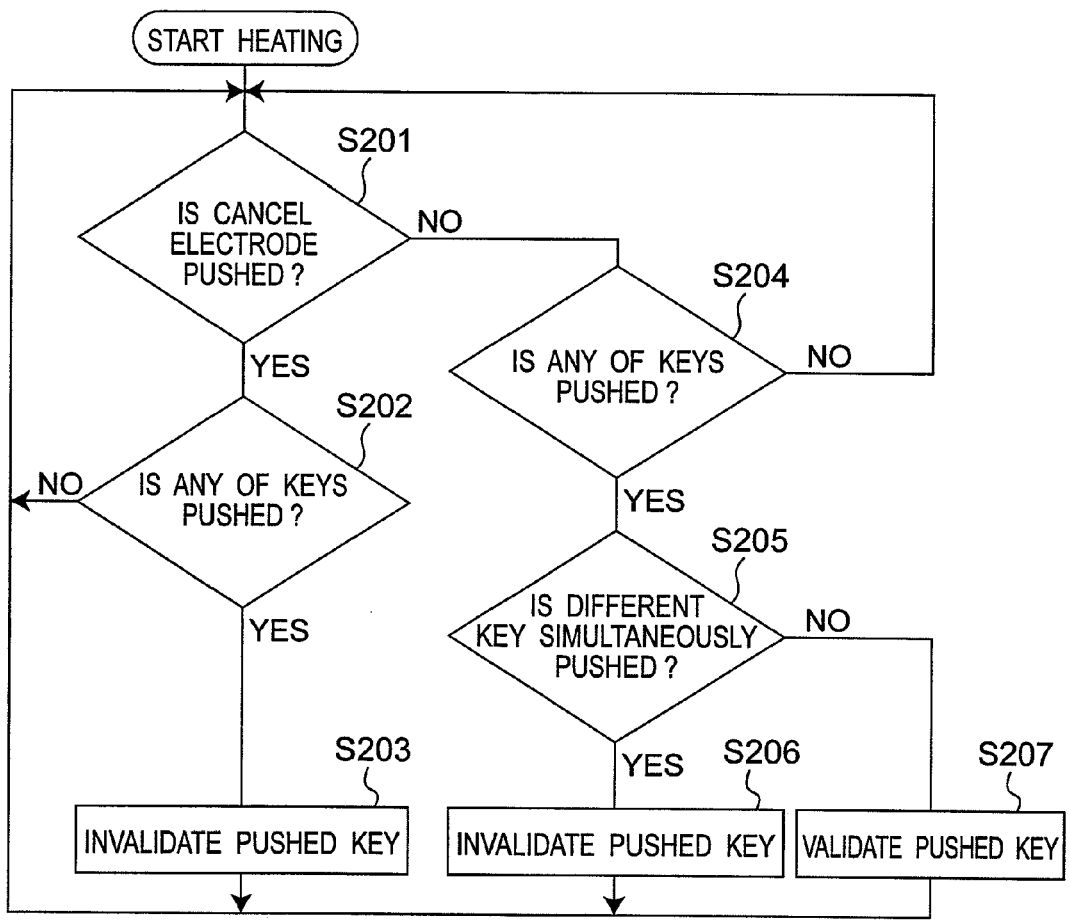
FIG. 8 is a flowchart of the cooking device of the second embodiment of the present invention.

The flow on whether the control command is executed or invalidated, as shown in FIGS. 7A to 7D, will be described using FIG. 8. FIG. 8 is a flowchart of the operation executed by the control unit 8. In the flowchart of FIG. 8, the operation of when heating the object to be heated 4 with the heating unit 14 provided on the left side of FIG. 6 will be described as an example with reference to the detection signal waveforms of FIGS. 7A to 7D.

The control unit 8 determines whether or not the cancel electrode 5b corresponding to the heating coil 10 in heating is pushed (S201). If the cancel electrode 5b is pushed (upper surface of the top plate 1 at the upper part near the cancel electrode 5b is touched with a finger) (after time point t0 in FIG. 7B, after time point t5 in FIG. 7C, time point t0 to t2 in FIG. 7D), it is determined whether or not any of the plurality of touch keys 13a to 13c configuring the operation unit 130 corresponding to the heating coil 10 in heating is pushed (S202). If any of touch keys is pushed (YES in S202) while the pushing of the cancel electrode 5b is detected (YES in S201) (time point t1 in FIGS. 7B and 7D), the operation by the pushed touch key is invalidated (S203) (time point t3 in FIGS. 7B and 7D). In other words, control is performed so as not to change the operation state of the heating coil 10 according to the control command assigned to the pushed touch key. For instance, if the touch key 13c for stopping the heating is pushed during heating, the heating is not stopped and the heating state is continued. If detected that the touch key 13b for raising the heating power is pushed, the heating coil 10 is controlled so as not to raise the heating power in response to the pushing of the touch key 13b. If the touch key 13b is not pushed in step S202 although the cancel electrode 5b is pushed, no process is performed, and the process returns to step S201.

Therefore, when it is detected that the cancel electrode 5b is pushed, the control state of the heating source in time of detection is continued. Furthermore, if detected that the cancel electrode 5b is pushed, the control command assigned to the touch key is not executed even if detected that the relevant touch key 13 is pushed. If it is detected that at least one of the touch keys 13 is pushed and the cancel electrode 5b is not continuously pushed for a predetermined time, it is appropriately judged that at least one of the touch keys 13 has been operated and the control command assigned to the relevant touch key 13 is executed. Providing the first predetermined time is effective in preventing false operation.

If the cancel electrode 5*b* is not pushed in step S201, it is determined whether or not any of the plurality of touch keys 13*a* to 13*c* configuring the operation unit 130 corresponding to the heating coil in heating is pushed (S204). If any of the touch keys 13*a* to 13*c* is pushed, it is determined whether or not a different touch key is simultaneously pushed (S205). The operation by all pushed touch keys is invalidated (S206) if the different touch key is simultaneously pushed, and the operation by the pushed touch key is validated (S207) if the different touch key is not simultaneously pushed.

2.3 Conclusion

According to the induction cooking device of the present embodiment, when the cancel electrode 5*b* is pushed or when the user or some kind of object being touched by a grounded portion exists at the upper surface of the top plate 1 facing the cancel electrode 5*b* while the heating coil 10 is heating the object to be heated 4, the changing of the heating operation of the heating coil 10 by the operation of the touch key simultaneously pushed with the cancel electrode 5*b* is invalidated. Since the cancel electrode 5*b* is provided in the vicinity of the touch keys 13*a* to 13*c*, when some kind of object touches the upper part of any of the touch keys 13*a* to 13*c*, the object often touches the upper side of the cancel electrode 5*b* provided in the vicinity of the touch keys 13*a* to 13*c* at the same time. Thus, when the cooker touched with a hand is placed on the upper surface of one or more touch keys, when an object spilled-out from the object to be heated 4, water, and the like is attached to the frame 11 normally grounded with the touch key, or when the user wipes the object spilled-out from the object to be heated 4 and the like with a cloth and the like, the operation of the simultaneously pushed touch key can be invalidated by the cancel electrode 5*b*. The operation unintended by the user is not performed and the fluctuation of the conduction control on the heating coil can be prevented. For instance, the heat cooking can be continued while preventing unintended start of heating or unintended stop of heating. The safety and the convenience of the user are thereby enhanced.

According to the present embodiment, in a case where two or more touch keys are simultaneously pushed, the operation according to such touch keys is invalidated. Thus, when some kind of object touches and operates a plurality of touch keys such as when the cooker is placed, when an object spilled-out from the object to be heated 4, water, and the like is attached, or when the user wipes the object spilled-out from the object to be heated 4 and the like with cloth, without touching the upper surface of the top plate 1 facing the cancel electrode 5*b*, the heating can be continued without performing the operation unintended by the user. The safety and convenience thus can be effectively enhanced, and the operability by the touch key can be enhanced.

The cancel electrode 5*b* is prevented from being mistakenly touched when operating the operation unit 130 by arranging the cancel electrode 5*b* so as to surround the periphery of the operation unit 130 with the user side (near side) opened, that is, by not arranging the cancel electrode 5*b* on the user side of the operation unit 130. When operating the operation unit 130 with a finger, the operation unit is touched with the finger tip and the entire finger is positioned to be inclined diagonally towards the near side, and thus the finger contacts the top plate 1 in a broader range on the near side and the proximity degree becomes high. Furthermore, since the operation unit 130 is provided on the user side of the top plate 1 so as to be easily operated by the user, if the cancel electrode 5*b* is provided so as to surround the entire operation unit 130 including the user side, the possibility of mistakenly touching the cancel electrode by the user during cooking becomes high and the cancel electrode 5*b* becomes too close to the metal frame 11. The frame 11 is connected to the ground (earth) by being connected to the device main body or the kitchen, and thus the voltage of the cancel electrode 5*b* remains decreased if the cancel electrode 5*b* is close to the metal frame 11, and the control unit 8 may mistakenly judge that the cancel electrode 5*b* is remained pushed. However, according to the present embodiment, the cancel electrode 5*b* is provided with the user side opened, and thus the cancel electrode 5*b* will not be unintentionally touched during the operation or approached and the voltage of the cancel electrode 5*b* will not remain reduced. Therefore, when arranging the cancel electrode 5*b* on the user side of the operation unit 130, the distance between the cancel electrode 5*a* and the operation unit 130 on the user side is preferably made larger than the distance between the cancel electrode 5*b* and the operation unit 130 on the heating coil 10 side.

2.4 Variant

The present embodiment employs a configuration of detecting that the electrode unit 3 and the cancel electrode 5*a* are simultaneously touched with the finger when both the impedance between the electrode unit 3 and the earth and the impedance between the cancel electrode 5*a* and the earth lower compared to when not touched with the finger, but the configuration of detecting simultaneous touching is not limited thereto. For instance, simultaneous touching of the electrode unit 3 and the cancel electrode 5*a* may be detected from the increase in capacitance between the electrode unit 3 and the cancel electrode 5*a*. Furthermore, a common electrode connected to the common potential of the control unit 8 may be formed in the vicinity of the electrode unit 3, and is may be detected that the electrode unit 3 is touched by detecting the increase in capacitance between the electrode unit 3 and the common potential. Similarly, a common electrode connected to the common potential of the control unit 8 may be formed in the vicinity of the cancel electrode 5*a*, and it may be detected that the cancel electrode 5*b* is touched by detecting the increase in capacitance between the cancel electrode 5*a* and the common potential.

In the present embodiment, the operation of the touch key simultaneously pushed with the cancel electrode 5*b* is invalidated while detection is being made that something is touching the upper surface of the top plate 1 facing the cancel electrode 5*b*. However, the key to be invalidated may not be only the touch key simultaneously pushed with the cancel electrode 5*b*. The operation of all touch keys 13*a* to 13*c* configuring the operation unit 130 may be invalidated. The false operation is thereby prevented, and the safety is further enhanced.

The induction cooking device of the present embodiment operates such that only the pushed touch key is invalidated when two or more touch keys are simultaneously pushed in the operation unit 130, but the operation of all touch keys 13*a* to 13*c* configuring the operation unit 130 may be invalidated.

In the present embodiment, is has been described that when the cancel electrode 5*b* and the touch key are simultaneously pushed, the operation by such touch key is invalidated, but the operation by the touch key may be invalidated not only when simultaneously pushed but even when pushed in the order from the cancel electrode 5*b* to the touch key 13 or from the touch key 13 to the cancel electrode 5*b* within a predetermined time (second predetermined time, e.g., 0.5 seconds). In other words, the control unit 8 performs a control such that the conduction state to the heating coil 10 based on the control command input to any of the touch keys 13a to 13c cannot be changed within a predetermined time after detecting that the portion of the top plate 1 in the vicinity of the cancel electrode 5b is not touched with the finger from the state of detecting that the portion of the top plate 1 in the vicinity of the cancel electrode 5b is touched, so that similar effects are obtained.

Similarly, not limited to when two or more touch keys are simultaneously pushed, even if a different touch key is pushed within a predetermined time (second predetermined time, e.g., 0.5 seconds) after a certain touch key is pushed, the operation by such touch keys may be invalidated. For instance, if a different touch key is pushed before the elapse of the second predetermined time after one of the plurality of touch keys is pushed, both the operation by the touch key pushed firstly and the operation by the touch key pushed afterward are invalidated or all the keys configuring the operation unit including the pushed touch keys are invalidated. In other words, if the conduction control by the touch key pushed firstly is already being carried out, the conduction control already being carried out may be stopped. For instance, in a case where the control unit 8 controls the conduction of the heating coil 10 when the touch key is pushed for the first predetermined time (e.g., 0.1 seconds), the conduction control based on the touch key pushed firstly is already performed if the first predetermined time is shorter than the second predetermined time. In this case, the conduction control based on the touch key pushed firstly is stopped. The touch key is thus prevented from operating even when the object spilled-out from the object to be heated 4, water, and the like are attached to the top plate and the user wipes the same with a cloth and the like such that adjacent touch keys are pushed in order. The heating thus can be safely continued without performing the operation unintended by the user, and the usability further enhances.

If the different touch key is pushed within a predetermined time (third predetermined time, e.g., 0.4 seconds) from when a certain touch key is no longer pushed, the operation by the different touch key may be invalidated, where similar effects still can be obtained. The third predetermined time may be the same length as the second predetermined time or may be longer or shorter than the second predetermined time.

In the present embodiment, the key operation is invalidated when any two or more keys are simultaneously pushed, where any two or more keys may be adjacent touch keys (e.g., touch key 13a and touch key 13b) lined on the same line, or may be non-adjacent touch keys (e.g., touch key 13a and touch key 13c).

In FIG. 6, the cancel electrode 5b is provided so as to surround the touch keys 13a to 13c with the user side opened, but may be provided only on the heating unit 14 side with the portion at the side of the touch keys 13a and 13c omitted.

In the present embodiment, the cancel electrode 5b is provided only on the lower surface of the top plate 1, but may be configured by arranging the electrode on the upper surface and the lower surface of the top plate 1. The cancel electrode 5b may be provided only on the upper surface of the top plate 1. Similarly, the electrode of the touch key 13 formed on the upper surface of the top plate 1 may be omitted.

The position where the cancel electrode 5b is provided may be visible. If the position of the cancel electrode 5b can be recognized by the user, the invalidation of the operation by the touch key 13 when the cancel electrode 5b is pushed can be easily recognized.

When the cancel electrode 5b is continuously pushed for longer than or equal to a predetermined time, the informing unit 12 may inform it. The user thus can easily recognize that the operation by the touch key 13 is invalidated, whereby usability is enhanced for the user.

In the present embodiment, the touching of the top plate 1 facing the cancel electrode 5b may include not only when immediately above the cancel electrode 5b is touched but also when the vicinity of the outer edge of the cancel electrode 5b is touched.

In the present embodiment, the operation unit 130 is configured by three touch keys 13a to 13c, but the number of touch keys configuring the operation unit 130 is arbitrary. For instance, in the induction cooking device that invalidates the operation of the touch key 13 with the cancel electrode 5b, the touch key 13 configuring the operation unit 130 merely needs to be one or more.

Even in a configuration in which the cancel electrode 5b is not provided, the operation by the touch key 13 can be invalidated when two or more touch keys 13 are pushed simultaneously or within a predetermined time.

In the present embodiment, the heating unit 14, the operation unit 130, and the cancel electrode 5b of the same configurations are provided two by two, but such number is an example, and merely needs to be one or more.

The induction cooking device has been described in the present embodiment, but the configuration and the control of the touch key of the present invention can also be adapted to other cooking devices including touch keys, for example, a gas cooking device, a halogen cooking device, a radiant cooking device, and the like.

The present invention is useful in the induction cooking device including touch keys since the unintended operation of the user can be prevented even if the touch key is carelessly pushed for some reason, and the safety and convenience can be effectively enhanced. The present invention can be applied to to the electric heater cooking device using an electrical heating element other than the heating coil as the heating source, and a gas cooking device using gas as the heat source. In the case of the gas cooking device, a gas burner may be provided by forming a hole in the top plate.

The first embodiment and the second embodiment may be combined. For instance, the control shown in FIG. 8 of the second embodiment may be performed with the configuration of the first embodiment. Alternatively, the configuration including the contact electrode 3b may be adopted in the second embodiment, and the cancel electrode 5b of the second embodiment and the cancel electrode 5a of the first embodiment may be formed to the same shape. Both effects from the first embodiment and the second embodiment are thereby obtained. Thus, the conduction control to the heating coil 10 can be prevented from being performed as much as possible when the user is not intending to operate the touch key.

INDUSTRIAL APPLICABILITY

The cooking device of the present invention is useful for the cooking device including touch keys since the operation based on the control command assigned to the touch key is prevented from being executed when the user is not intending to operate the touch key.

The invention claimed is:
1. A cooking device comprising:
a heating source operable to heat an object to be heated;
a top plate provided on an upper surface of the cooking device;
a metal frame provided at a periphery of the top plate and connected to the earth;

an electrode unit including a key electrode provided on a lower surface of the top plate and a contact electrode provided on the lower surface of the top plate and electrically connected with the key electrode, the electrode unit operable to input an assigned control command when the top plate in the vicinity of the key electrode is touched with a finger;

a control unit electrically connected with the contact electrode by means of a conductive connection member contacted with the contact electrode, the control unit being operable to apply a high frequency signal to the electrode unit and detect that the vicinity of the electrode unit is touched to control conduction to the heating source based on the control command;

a cancel electrode provided on the lower surface of the top plate around the key electrode and contact electrode except at a near side of the top plate so as to surround the key electrode and the contact electrode except at the near side of the top plate, wherein a distance between the contact electrode and the cancel electrode is smaller than a predetermined width; and a light source provided on a lower side of the key electrode, wherein the light source irradiates a cutout portion formed by cutting out a part of the key electrode with light;

wherein the control unit is electrically connected to the cancel electrode by means of another conductive connection member to apply a high frequency signal to the cancel electrode, and limits an operation based on the control command when detecting that the vicinity of the cancel electrode is touched.

2. The cooking device according to claim 1, wherein the limitation of the operation based on the control command when detecting that the vicinity of the cancel electrode is touched includes invalidating the conduction to the heating source based on the control command.

3. The cooking device according to claim 2, wherein the control unit invalidates the conduction control on the heating source based on the control command transmitted from the electrode unit when detecting that the vicinity of the cancel electrode is touched within a predetermined time after detecting a change in a state of the vicinity of the electrode unit from being touched to not being touched and/or when detecting that the vicinity of the electrode unit is touched within a predetermined time after detecting a change in a state of the vicinity of the cancel electrode from being touched to not being touched.

4. The cooking device according to claim 1, wherein the limitation of the operation based on the control command when detecting that the vicinity of the cancel electrode is touched includes making the detection that the vicinity of the key electrode is touched difficult.

5. The cooking device according to claim 4, wherein the control unit makes the detection that the vicinity of the key electrode is touched difficult within a predetermined time after detecting a change in a state of the vicinity of the cancel electrode from being touched to not being touched.

6. The cooking device according to claim 1, wherein the control unit includes a key input detection reference value which is a reference in detecting that the vicinity of the key electrode is touched, and
the control unit changes the key input detection reference value to a value difficult to detect the touching of the vicinity of the key electrode when detecting that the vicinity of the cancel electrode is touched.

7. The cooking device according to claim 1, wherein the control unit includes a cancel input detection reference value which is a reference in detecting that the vicinity of the cancel electrode is touched, and
the control unit changes the cancel input detection reference value to a value difficult to detect the touching of the vicinity of the cancel electrode when detecting that the vicinity of the key electrode is touched.

8. The cooking device according to claim 1, further comprising an informing unit operable to inform when the detection that the vicinity of the cancel electrode is touched and the detection that the vicinity of the key electrode is touched are simultaneously made.

9. The cooking device according to claim 1, further comprising an informing unit operable to inform when the touching of the vicinity of the cancel electrode is continuously detected for longer than or equal to a predetermined time.

10. The cooking device according to claim 1, further comprising another key electrode,
wherein the control unit controls the conduction to the heating source based on the control command when detecting that the vicinity of the key electrode is continuously touched for longer than or equal to a first predetermined time, and invalidates the conduction control on the heating source based on the control command corresponding to a combination of the key electrode and the other key electrode when detecting that the vicinity of the other key electrode is touched before a second predetermined time longer than the first predetermined time has elapsed from when the vicinity of the key electrode is touched.

11. The cooking device according to claim 1, wherein the predetermined width is approximately 7 to 10 mm.

* * * * *